United States Patent
Bjork

(10) Patent No.: US 6,476,629 B1
(45) Date of Patent: Nov. 5, 2002

(54) IN-TRAY BURN-IN BOARD FOR TESTING INTEGRATED CIRCUIT DEVICES IN SITU ON PROCESSING TRAYS

(75) Inventor: Russell S. Bjork, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/510,793

(22) Filed: Feb. 23, 2000

(51) Int. Cl.⁷ .......................... G01R 31/26; G01R 31/02
(52) U.S. Cl. ...................... 324/765; 324/758; 324/158.1
(58) Field of Search ................................ 324/765, 760, 324/755, 158.1, 758

(56) References Cited

U.S. PATENT DOCUMENTS

| | | | |
|---|---|---|---|
| 4,660,282 A | 4/1987 | Pfaff .......................... 29/829 |
| 4,684,182 A | 8/1987 | Gussman ..................... 439/68 |
| 4,779,047 A | 10/1988 | Solstad et al. .............. 324/760 |
| 4,817,273 A | 4/1989 | Lape et al. ................... 29/741 |
| 5,093,982 A | 3/1992 | Gussman ..................... 29/705 |
| 5,103,976 A | 4/1992 | Murphy ....................... 206/719 |
| 5,149,662 A | 9/1992 | Eichelberger ................ 438/15 |
| 5,180,974 A | * 1/1993 | Mitchell et al. .......... 324/158.1 |
| 5,203,452 A | 4/1993 | Small et al. ................. 206/725 |
| 5,247,248 A | 9/1993 | Fukunaga .................... 324/760 |
| 5,267,395 A | 12/1993 | Jones, Jr. et al. ............. 29/829 |
| 5,307,011 A | 4/1994 | Tani ......................... 324/158.1 |
| 5,329,093 A | 7/1994 | Okano ........................ 324/537 |
| 5,367,253 A | 11/1994 | Wood et al. ................. 324/754 |
| 5,492,223 A | 2/1996 | Boardman et al. .......... 206/509 |
| 5,509,193 A | 4/1996 | Nuxoll ......................... 29/759 |
| 5,517,125 A | 5/1996 | Posedel et al. ............. 324/760 |
| 5,532,612 A | 7/1996 | Liang ......................... 324/754 |
| 5,636,745 A | 6/1997 | Crisp et al. ................. 206/509 |
| 5,656,945 A | 8/1997 | Cain ........................... 324/755 |
| 5,748,007 A | 5/1998 | Gaschke ..................... 324/754 |
| 5,842,272 A | 12/1998 | Nuxoll ......................... 29/759 |
| 5,865,639 A | 2/1999 | Fuchigami et al. ......... 439/330 |
| 5,888,837 A | 3/1999 | Fillion et al. ................. 438/15 |
| 5,927,503 A | 7/1999 | Nevill et al. ................. 206/701 |
| 5,982,185 A | * 11/1999 | Farnworth .................. 324/755 |

\* cited by examiner

Primary Examiner—Michael Sherry
Assistant Examiner—Paresh Patel
(74) Attorney, Agent, or Firm—TraskBritt

(57) ABSTRACT

An in-tray burn-in board for burn-in and electrical testing of a plurality of integrated circuit devices disposed in one or more processing trays. The in-tray burn-in board includes a plurality of electrical contacts disposed on an interface surface for establishing, through engagement with one or more processing trays, electrical communication between the leads of the integrated circuit devices and a tester. One or more in-tray burn-in boards may each be coupled with at least one processing tray, such that a plurality of integrated circuit devices may be subjected to burn-in and other electrical testing without removing the integrated circuit devices from the processing trays, thereby reducing the time and cost associated with handling integrated circuit devices during manufacturing.

5 Claims, 5 Drawing Sheets

IN-TRAY BURN-IN BOARD FOR TESTING INTEGRATED CIRCUIT DEVICES IN SITU ON PROCESSING TRAYS

BACKGROUND OF THE INVENTION

1. Field of the Invention

The present invention relates generally to the manufacture and processing of integrated circuit devices. Specifically, the present invention relates to an in-tray burn-in board and method of use for performing burn-in and electrical testing of a plurality of integrated circuit devices disposed in processing trays.

2. State of the Art

During the manufacture of integrated circuit (IC) devices, processing trays—also referred to as component trays, in-process trays, or carrier trays—are typically used throughout many phases of production for handling IC devices. Processing trays may be configured for use with a number of different types of packaged IC devices, including dual in-line packages (DIP's), zigzag in-line packages (ZIP's), thin small outline packages (TSOP's), small outline J-lead packages (SOJ's), ball-grid arrays (BGA's), pin-grid arrays (PGA's), quad flat packages (QFP's), pad array carriers (PAC's), and plastic leaded chip carriers (PLCC's). Processing trays may also be designed for handling bare, or unpackaged, semiconductor dice. The configuration of processing trays varies depending on the type of IC device that a particular tray is designed for use with and, also, on the function that tray is designed to perform.

Processing trays may be configured for transporting IC devices between various manufacturing work stations where a specific production step, such as, for example, burn-in testing, may be conducted. Processing trays may also be configured for the storing and shipping of IC devices. Trays used for shipping IC devices are often custom designed for a specific customer—generally referred to as customer trays—depending on the needs of that customer. U.S. Pat. No. 5,492,223 to Boardman et al., U.S. Pat. No. 5,203,452 to Small et al., U.S. Pat. No. 5,927,503 to Nevill et al., U.S. Pat. No. 5,103,976 to Murphy, and U.S. Pat. No. 5,636,745 to Crisp et al. disclose processing trays that may be used for processing, handling, shipping, or storage, or a combination thereof, of IC devices. These conventional trays generally include a frame enclosing a planar, open lattice structure. The latticework forms a two-dimensional array of cells, each cell being adapted to receive an individual IC device.

Another conventional processing tray design widely used within the semiconductor industry for handling IC devices during production is the JEDEC tray. These trays are designed and built in compliance with standards propagated by the Joint Electronic Device Engineering Counsel (JEDEC). Generally, a JEDEC tray includes a grid-like, open lattice structure that forms a planar, two-dimensional array of IC cells. Each IC cell is adapted to hold a single IC device. JEDEC trays are usually injection molded from plastic and vary in overall dimensions and grid size depending on the type of IC device the tray is designed to hold. JEDEC trays are stackable and also have surface features, such as locating and hold-down tabs, that facilitate manipulation of the trays by automatic processing and testing equipment.

Another device used for handling IC devices is a burn-in board. A burn-in board is a type of IC device carrier specifically designed for holding a plurality of IC devices during burn-in and electrical testing. Burn-in is a procedure directed to the detection of IC devices likely to fail during the first few hours of operation, prior to the installation of those IC devices in higher-level packaging for eventual inclusion in electronic equipment. Burn-in testing of IC devices typically comprises the application of specified electrical biases and signals in a controlled temperature environment. The characteristics, such as voltage and frequency, of the specified electrical biases and signals may be configured so as to subject the IC devices to a test environment more severe than the electrical environment the IC devices will likely experience during normal operation. Other environmental variables such as, for example, humidity may also be controlled during burn-in testing.

During a typical burn-in test, a plurality of IC devices is mounted on one or more burn-in boards, which are then placed in a test chamber having a controllable environment. Specified electrical biases and signals are applied to the IC devices while also subjecting the IC devices to thermal cycling, in which the temperature inside the test chamber is cycled between an elevated temperature—a temperature in excess of the ambient operating temperature the IC devices will likely experience during normal operation—and a below-ambient temperature—a temperature lower than the ambient operating temperature the IC devices will likely experience during normal operation. Thermal cycling may include multiple temperature cycles, as well as extended testing at a specific temperature such as, for example, an elevated temperature. Applying electrical biases to the IC devices during thermal cycling accelerates the stress to which the IC devices are subjected to during burn-in. Therefore, marginal devices that might otherwise fail sometime after being placed in service are caused to fail during burn-in and are thus eliminated before shipment to customers or assembly into electronic equipment.

Electrical testing is a procedure used to verify that IC devices function according to their minimum rated specifications and to classify IC devices based on their operating characteristics. In electrical testing, a more complete set of operating electrical signals is supplied to the IC devices to provide a thorough evaluation of their functions. After electrical testing, the IC devices may be sorted—based on an IC device's electrical characteristics exhibited under test—into categories, or "bins," according to a predetermined set of performance characteristics.

Conventional burn-in boards, which are commonly fabricated as printed circuit boards, exist in a wide variety of configurations. For example, U.S. Pat. No. 5,093,982 to Gussman, U.S. Pat. No. 5,329,093 to Okano, U.S. Pat. No. 4,684,182 to Gussman, and U.S. Pat. No. 5,247,248 to Fukunaga disclose burn-in boards for testing a plurality of IC devices. In addition, U.S. Pat. No. 5,517,125 to Posedel et al., U.S. Pat. No. 5,888,837 to Fillion et al., U.S. Pat. No. 5,367,253 to Wood et al., and U.S. Pat. No. 5,149,662 to Eichelberger disclose carrier trays specifically adapted for burn-in of a plurality of bare semiconductor dice. Also, U.S. Pat. No. 4,779,047 to Solstad et al. discloses a burn-in board configured for use with IC devices mounted on a carrier tape.

During the manufacture of IC devices, considerable time, labor, and cost are expended in handling IC devices throughout the many phases of production. For example, a plurality of IC devices may be disposed on a first processing tray for storage during production and for transportation within the manufacturing facility. That plurality of IC devices may then be unloaded from the first processing tray and disposed on a burn-in board for burn-in and electrical testing. Upon completion of burn-in and electrical testing, the plurality of IC devices may be sorted according to performance characteristics observed during burn-in and electrical testing. The sorted IC devices may again be placed on processing trays for handling and transportation within the manufacturing facility.

As evidence of the high costs to IC device manufacturers resulting from the handling of IC devices during production, much effort has been devoted to developing automated equipment specifically directed to the loading and unloading of IC devices for burn-in and electrical testing. For example, U.S. Pat. No. 5,307,011 to Tani, U.S. Pat. No. 4,660,282 to Pfaff, U.S. Pat. No. 5,267,395 to Jones, Jr. et al., U.S. Pat. No. 5,509,193 to Nuxoll, U.S. Pat. No. 5,842,272 to Nuxoll, and U.S. Pat. No. 4,817,273 to Lape et al. disclose apparatus for loading IC devices onto burn-in boards and for subsequent unloading of the IC devices onto processing trays or other transport media such as, for example, carrier tubes.

It is a continuing goal of the semiconductor industry to decrease the costs of fabricating IC devices while maintaining, or even improving, device integrity, performance and operating capabilities. One approach to achieving a reduction in manufacturing costs for IC devices is to reduce the costs associated with handling the IC devices throughout the manufacturing facility and all phases of production. Therefore, a need exists in the semiconductor industry for methods and devices directed toward reducing the time and cost associated with handling IC devices during production. Specifically, a need exists in the semiconductor industry for an apparatus and method of performing burn-in and electrical testing in situ on processing trays, thereby eliminating the need to load and subsequently unload IC devices between processing trays and burn-in boards.

SUMMARY OF THE INVENTION

Embodiments of the present invention include an in-tray burn-in board (BIB) for testing a plurality of IC devices disposed in a conventional processing tray. The in-tray BIB has a plurality of electrical contacts disposed on an interface surface that is configured to establish electrical contact with the leads or other terminals of IC devices carried by a processing tray. The electrical contacts may be spring loaded to bias the electrical contacts against the IC device leads. To facilitate alignment between the in-tray BIB and a processing tray, and electrical communication between the electrical contacts and the IC device leads, the in-tray BIB may also include one or more alignment surfaces, or one or more latching mechanisms.

Internal conductors carried by the in-tray BIB establish electrical communication between the electrical contacts and an electrical conduit. The electrical conduit is configured for connection to a tester to establish electrical communication between the tester and the IC devices. The tester, which may be used in conjunction with an environmental chamber, is then used to perform burn-in and other electrical testing of the IC devices disposed in a processing tray.

One or more in-tray BIBs according to the present invention may be associated with a test system, which may be automated. In one embodiment, the test system includes a displacement mechanism attached to an in-tray BIB—or, alternatively, associated with one or more processing trays—configured to move the in-tray BIB and at least one processing tray into mutual engagement. The test system may include a tray source configured to deliver processing trays and accompanying IC devices to the test system, and may also include a sorting apparatus for sorting and binning tested and characterized IC devices. In one embodiment, the test system includes a test frame configured to receive a plurality of test assemblies, each test assembly including an in-tray BIB in mutual engagement with at least one processing tray and the IC devices disposed therein. The test system may further include an environmental chamber configured to receive an in-tray BIB in mutual engagement with at least one processing tray or, alternatively, configured to receive a plurality of test assemblies disposed in the test frame.

BRIEF DESCRIPTION OF THE DRAWINGS

While the specification concludes with claims particularly pointing out and distinctly claiming that which is regarded as the present invention, the features and advantages of this invention can be more readily ascertained from the following detailed description of the invention when read in conjunction with the accompanying drawings, in which:

DETAILED DESCRIPTION OF THE PREFERRED EMBODIMENTS

FIGS. 1 through 8 contain many equivalent elements, and these equivalent elements will retain the same numerical designation in all figures.

Figure 1:
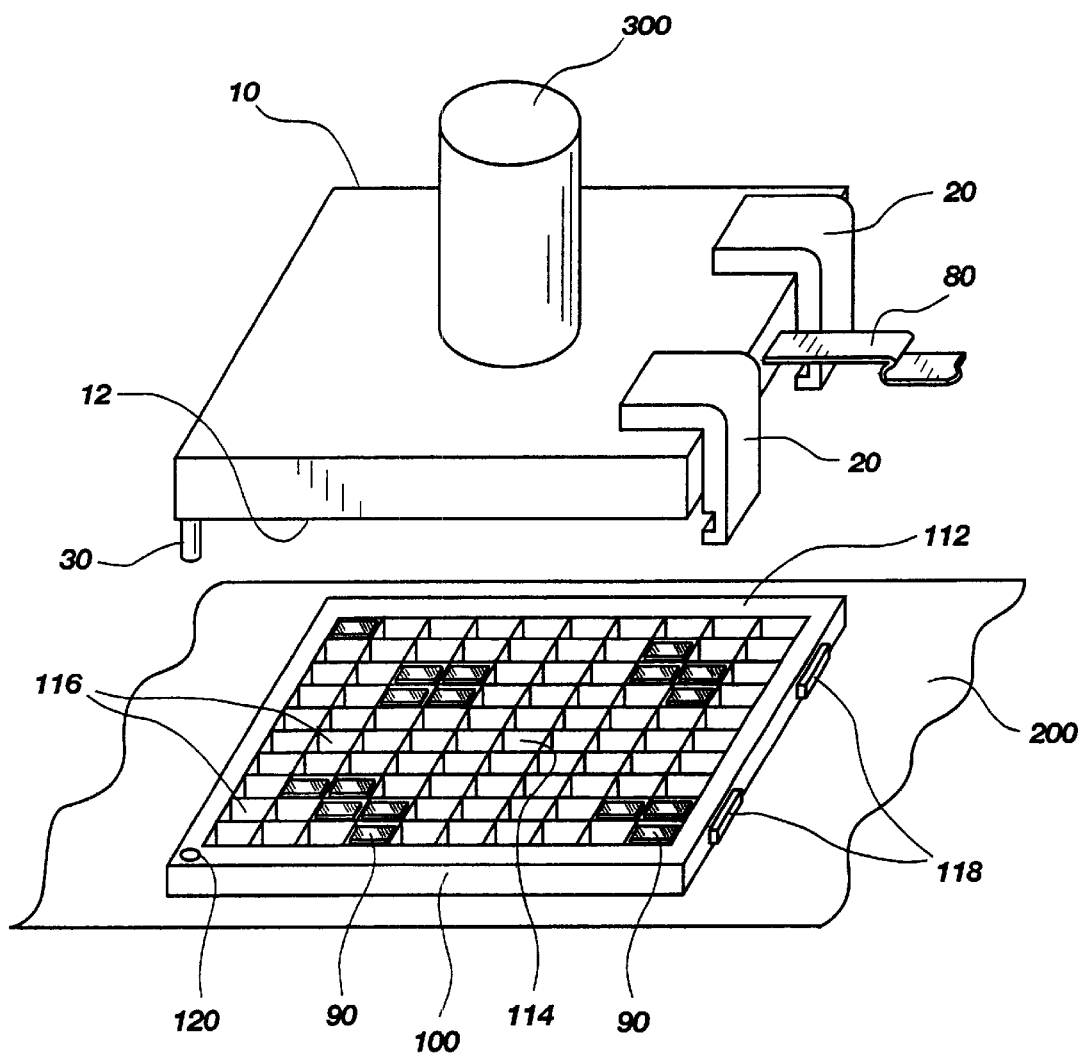
FIG. 1 is a perspective view of an in-tray burn-in board according to this invention and a conventional processing tray.

FIG. 1 shows an exemplary embodiment of an in-tray burn-in board (BIB) 10 according to this invention. The in-tray BIB 10 is associated with a tray source 200 configured to deliver a plurality of conventional processing trays 100 to the in-tray BIB 10. The in-tray BIB 10 has at least one interface surface 12 for establishing electrical communication with a plurality of IC devices 90 supported in a processing tray 100. The in-tray BIB 10 may also be connected to a displacement mechanism 300, which is configured to move the in-tray BIB 10 relative to the tray source 200, such that the interface surface 12 of the in-tray BIB 10 may engage the IC devices 90 disposed in a processing tray 100. Further, the in-tray BIB 10 may also include one or more latching mechanisms 20, and one or more alignment surfaces 30, disposed thereon. These and other features of the in-tray BIB 10 according to the present invention will be described hereinafter in greater detail.

Referring again to FIG. 1, each processing tray 100 delivered by tray source 200 generally includes a frame 112 enclosing an open lattice structure 114. The open lattice structure 114 defines a plurality of cells 116, each cell 116 being configured to receive an individual integrated circuit (IC) device 90. Thus, the processing tray 100 is capable of respectively receiving a plurality of IC devices 90 within the plurality of cells 116. A processing tray 1 00 may also have a plurality of tabs 118 extending from the frame 112. The tabs 118 provide additional surfaces for manipulation by automatic processing equipment to facilitate handling of the processing tray 100, and to ensure proper rotational alignment of the processing tray 100 and of the IC devices 90 and pin-outs thereof. Additionally, a processing tray 100 may have one or more locating features 120 disposed thereon for mating with a corresponding alignment surface 30 on the in-tray BIB 10. A processing tray 100 may be configured as any suitable tray configured to receive IC devices as is known in the art such as, by way of example only, trays designed in accordance with JEDEC standards.

Figure 2:
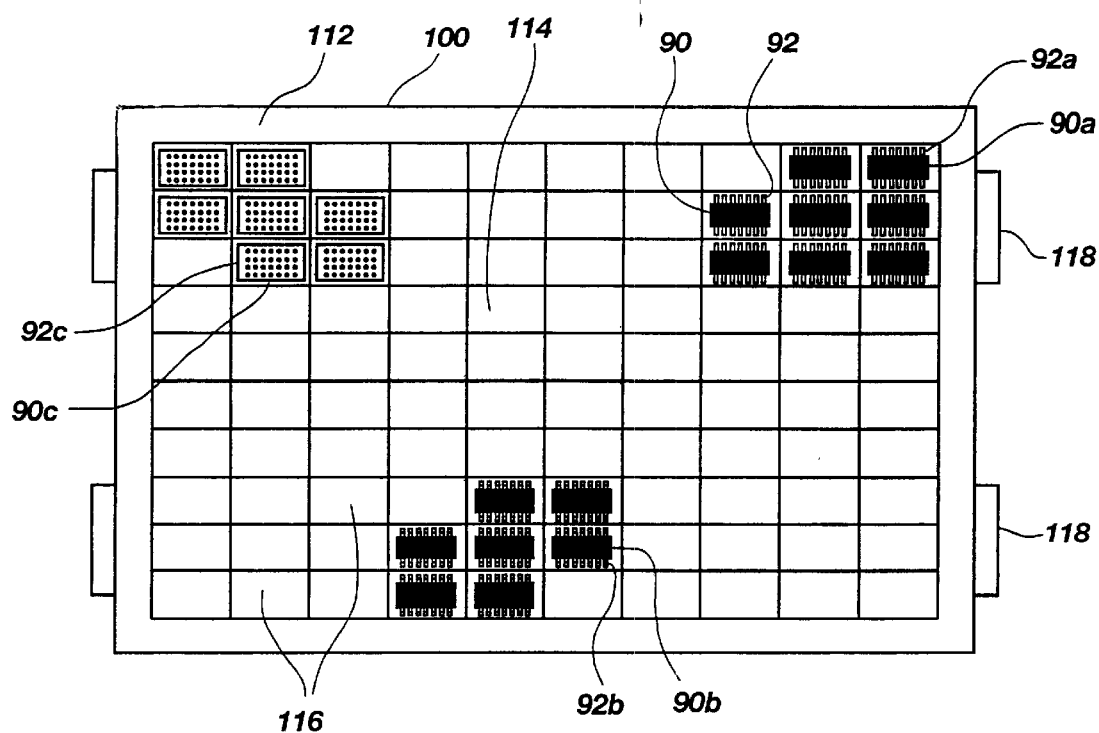
FIG. 2 is a plan view of a conventional processing tray having a plurality of IC devices located thereon.

FIG. 2 shows a processing tray 100 having a plurality of IC devices 90 received within its cells 116. Extending from each IC device 90 is a plurality of leads or terminals 92. The IC devices 90 may be configured as TSOP, SOJ, or other similar IC packages 90a, 90b, having leads 92a, 92b extending therefrom. The leads 92 of the IC devices 90 may extend towards or away from the processing tray 100. For example, the IC packages 90a are positioned within the processing tray 100 having their leads 92a extending downwardly, towards the processing tray 100. Alternatively, the IC packages 90b are received within the processing tray 100 with their leads 92b extending upwardly, away from the processing tray 100. The processing tray 100 may also be configured, for example, to receive a plurality of BGA packages 90c bearing an array of ball contact elements 92c. The BGA packages 90c may be conventional packages, chip-scale packages, or bare semiconductor dice having an array of contact or bond pads, which may have ball contact elements 92c attached thereto. Any other type of IC device as known in the art may be received within the processing tray 100.

Figure 3:
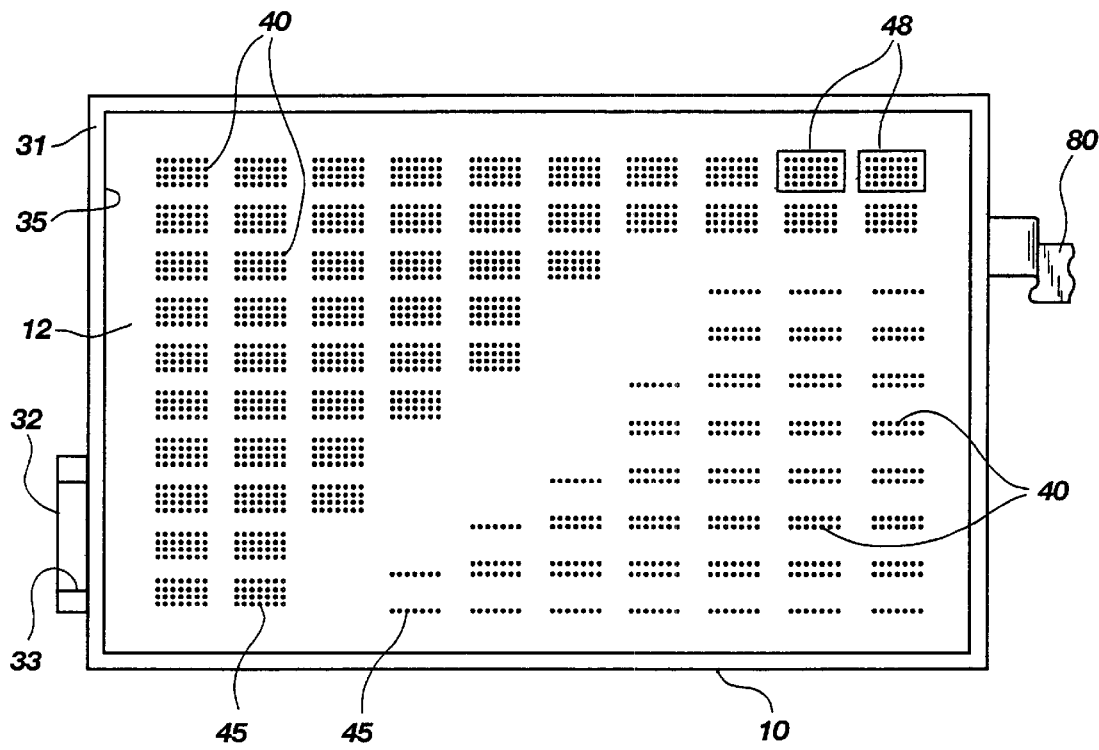
FIG. 3 is a plan view of the in-tray burn-in board of FIG. 1.

Referring to FIG. 3, an in-tray BIB 10 is shown with its interface surface 12 facing upwards. The interface surface 12 has a plurality of electrical contacts 40. The electrical contacts 40 may be arranged in a pattern—which will be referred to herein as a footprint 45—corresponding to the number, pitch (spacing), and arrangement of the leads 92 extending from the IC devices 90. The number of footprints 45 disposed on the in-tray BIB 10 may equal the number of cells 116 on a processing tray 100. Alternatively, the number of footprints 45 may be greater than the number of cells 116 of a processing tray 100 such that the in-tray BIB 10 may be adapted for use with different sizes and shapes of processing trays 100, or for simultaneous use with more than one processing tray 100.

The in-tray BIB 10 has an electrical conduit 80 extending therefrom for establishing electrical communication between the electrical contacts 40 and a tester (not shown in FIG. 3). The electrical conduit 80, depicted as a ribbon cable, may be any suitable cable, connector, or wiring as is known in the art. The electrical conduit 80 is in electrical communication with the plurality of electrical contacts 40 via internal conductors (not shown) on the in-tray BIB 10. The in-tray BIB 10 may, for example, be fabricated from conventional printed circuit board materials as are known in the art, in which case the internal conductors may be conductive traces formed, for example, on the surface of the printed circuit board opposite that on which electrical contacts 40 are carried. Alternatively, the in-tray BIB 10 may be manufactured as a multi-layer substrate and the internal conductors may be conductive traces formed on various layers of the multi-layer substrate as known in the art. Thus, the in-tray BIB 10 may be constructed using any suitable methods and materials as known in the art.

The electrical contacts 40 may comprise contact pads formed on the interface surface 12 or, alternatively, the electrical contacts 40 may comprise pins attached to the in-tray BIB 10 and extending therefrom. In a further embodiment, the electrical contacts 40 may be spring loaded pins that are biased away from the in-tray BIB 10 and towards the leads 92 of the IC devices 90 carried in a processing tray 100. During engagement between the interface surface 12 and a plurality of IC devices 90 supported within a processing tray 100, biasing the electrical contacts 40 towards the leads 92 may compensate for non-planarities of the interface surface 12, or for non-planarities of the IC devices 90, leads 92, or processing tray 100.

In another embodiment, a plurality of electrical contacts 40 comprising a footprint 45 is formed as a stand-alone socket 48. A plurality of stand-alone sockets 48 is then attached to the in-tray BIB 10 and is in electrical communication with the electrical conduit 80. Sockets 48 may be permanently secured to the in-tray BIB 10 or, alternatively, the sockets 48 may be removably secured to the in-tray BIB 10 so that different sockets 48 may be employed for engagement with differently configured IC devices 90. Further, the use of removable stand-alone sockets 48 facilitates replacement of worn or damaged electrical contacts 40. The electrical contacts 40 may be any other suitable electrical contact as is known in the art.

Figure 4:
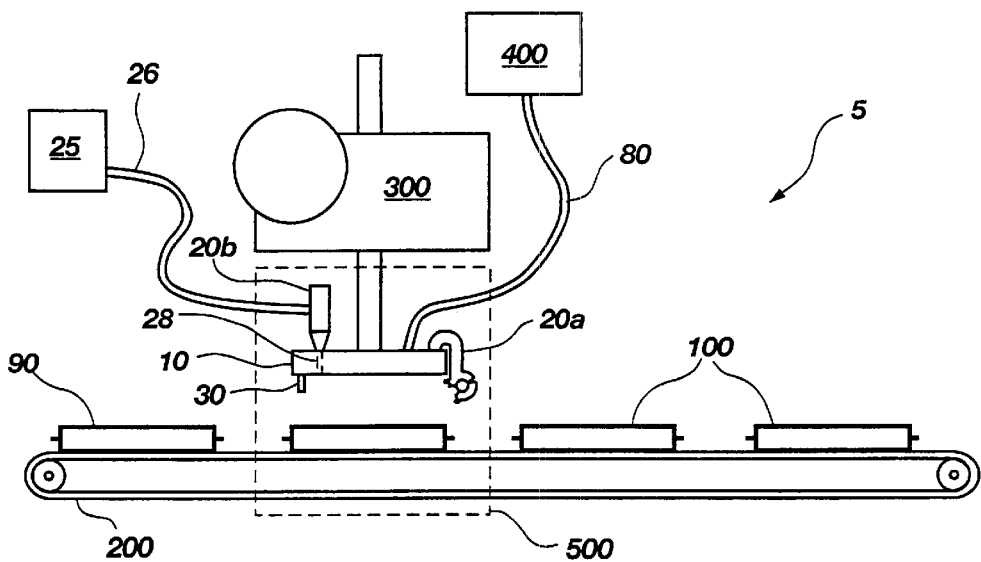
FIG. 4 is a schematic view of an IC device testing system having an in-tray burn-in board according to this invention.
Figure 5:
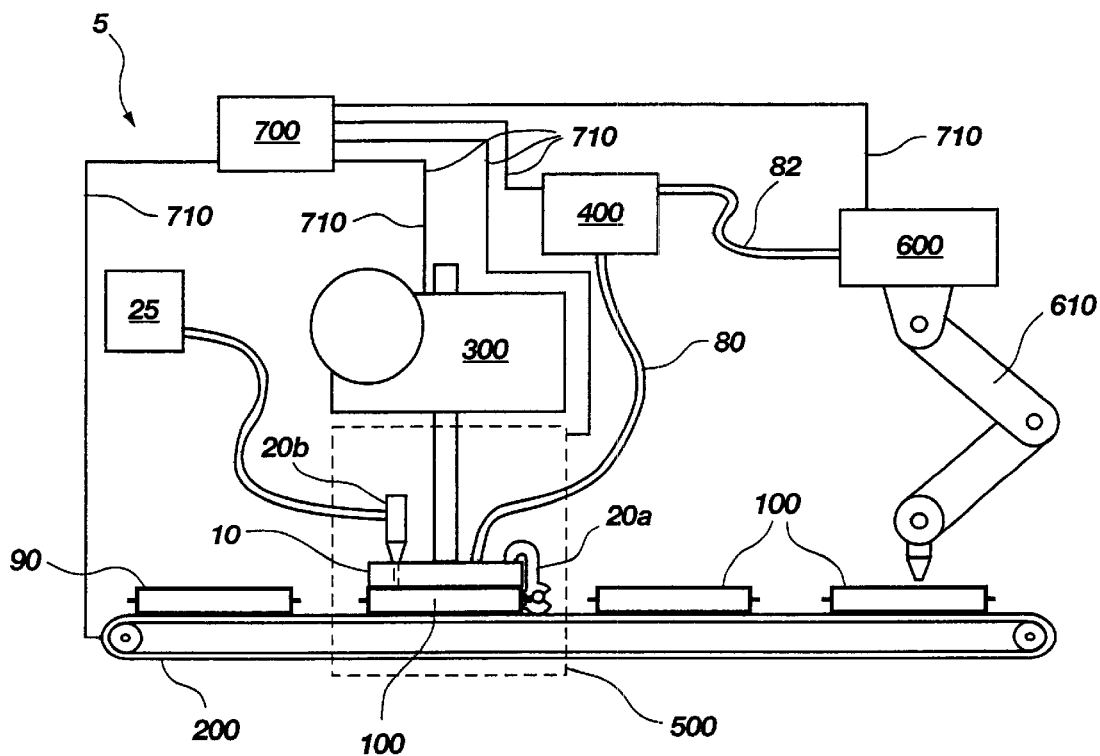
FIG. 5 is a schematic view of an IC device testing system having an in-tray burn-in board according to this invention.

Referring to FIG. 4 and FIG. 5, a burn-in and electrical testing system 5 that incorporates an in-tray BIB 10 according to the present invention is shown. As shown in FIG. 4, the in-tray BIB 10 is connected to a displacement mechanism 300. Alternatively, the processing tray or trays 100 may be associated with the displacement mechanism 300, or, in a further embodiment, both the in-tray BIB 10 and the processing tray or trays 100 are each associated with a displacement mechanism 300. A tray source 200—depicted in FIG. 4, by way of example only, as a conveyor—is disposed adjacent the in-tray BIB 10 and is configured to sequentially deliver one or more processing trays 100 to the in-tray BIB 10. The in-tray BIB 10 and its electrical contacts 40 are in electrical communication with a tester 400 via electrical conduit 80. The test system 5 may also include an environmental chamber 500 capable of controlling one or more desired environmental characteristics during testing such as, for example, temperature.

Figure 6:
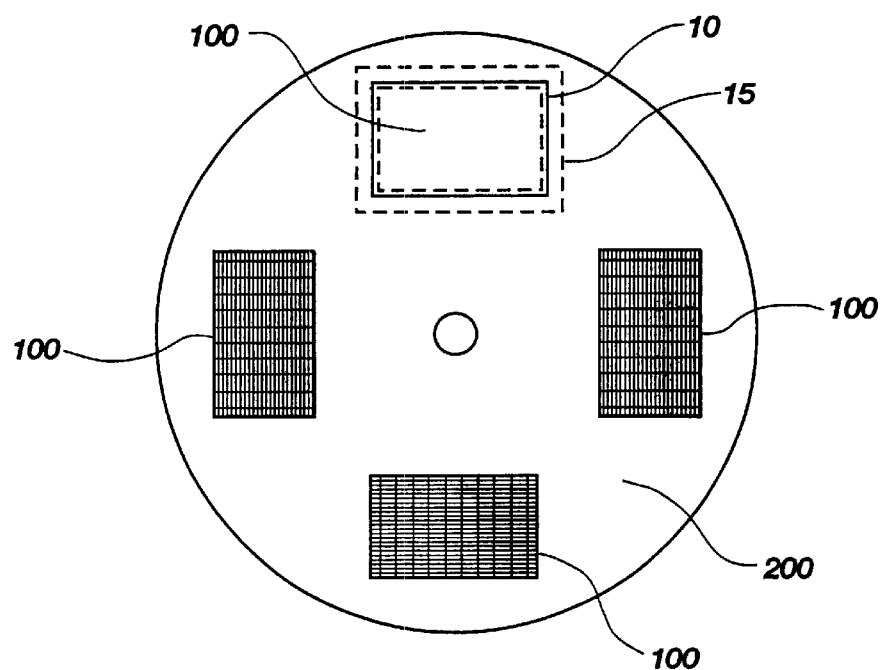
FIG. 6 is a plan view of a tray source and an in-tray burn-in board according to this invention.
Figure 7:
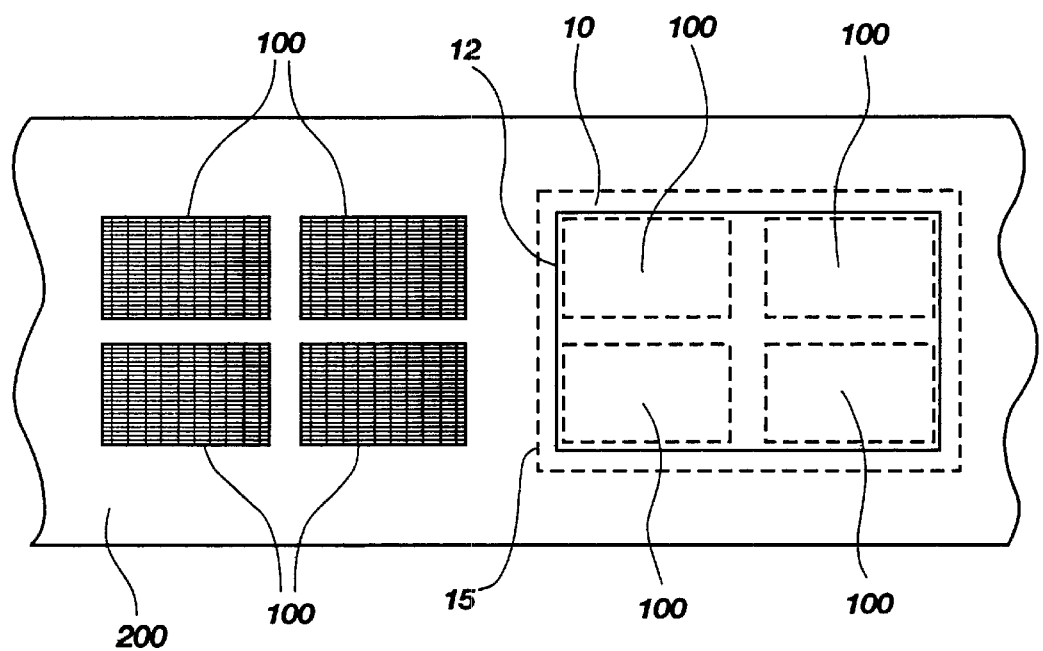
FIG. 7 is a plan view of a tray source and an in-tray burn-in board according to this invention.

Testing IC devices 90 in situ on processing trays 100 with the test system 5 and in-tray BIB 10 may be performed according to the following test sequence. Referring again to FIG. 4, a plurality of IC devices 90 is disposed in one or more processing trays 100. The tray source 200 delivers at least one processing tray 100 adjacent the in-tray BIB 10. As which is shown in FIG. 6, the tray source 200—shown as a rotary table—positions the processing tray 100 into a target zone 15. When positioned in the target zone 15, the processing tray 100 is at least substantially aligned with the in-tray BIB 10 such that, as the displacement mechanism 300 moves the in-tray BIB 10 and processing tray 100 into mutual engagement, the electrical contacts 40 of the interface surface 12 are aligned with the leads 92 of the IC devices 90. Those of ordinary skill in the art will appreciate that the displacement mechanism 300 may be configured to move the in-tray BIB 10, the processing tray or trays 100, or both the in-tray BIB 10 and processing tray or trays 100, in order to create mutual engagement therebetween. In a further embodiment, as shown in FIG. 7, the tray source 200 (shown as a conveyor) is configured to simultaneously deliver more than one processing tray 100 into a target zone 15. In the embodiment of FIG. 7, the in-tray BIB 10 has an interface surface 12 adapted to simultaneously engage a plurality of processing trays 100 and establish electrical communication with the IC devices 90 disposed thereon.

Once the tray source 200 has delivered one or more processing trays 100 into the target zone 15 adjacent the in-tray BIB 10, the displacement mechanism 300 moves the in-tray BIB 10 into engagement with the processing tray 100 (or into engagement with a plurality of processing trays 100). Upon engagement with the processing tray 100, the electrical contacts 40 on the interface surface 12 of the in-tray BIB 10 contact, and form electrical communication with, the leads 92 of the IC devices 90. As noted previously, the electrical contacts 40 may be spring-biased towards the leads 92. The IC devices 90 may then be subjected to burn-in and other electrical testing by tester 400 and, optionally, environmental chamber 500. Once testing of the IC devices 90 disposed in one or more processing trays 100 located in the target zone 15 has been completed, the displacement mechanism 300 will disengage the in-tray BIB 10 from the IC devices 90 and processing tray or trays 100. The tray source 200 will then deliver one or more other processing trays 100 into the target zone 15 and the test sequence may be repeated.

To facilitate alignment between the in-tray BIB 10 and one or more processing trays 100—as well as alignment between the electrical contacts 40 and the leads 92 of a plurality of IC devices 90—the in-tray BIB 10 may have one or more alignment surfaces. As shown in FIG. 1, an alignment surface 30 may comprise one or more register pins, which may have a circumferential surface tapered along their longitudinal axes, configured to engage one or more mating holes or other locating features 120 on a processing tray 100. Alternatively, as shown in FIG. 3, a flange 31 may provide one or more alignment surfaces. The flange 31 is configured to form a mating contact fit with at least a portion of the frame 112 of a processing tray 100. The flange 31 may extend about only a portion of the perimeter of the in-tray BIB 10 and may further include an inner surface 35 that is tapered. A tapered alignment surface may facilitate alignment between the in-tray BIB 10 and a processing tray 100 by functioning as a cam surface that, as the in-tray BIB 10 and processing tray 100 engage one another, preferentially moves the processing tray 100 into a predetermined, aligned position with respect to the in-tray BIB 10. In a further embodiment, as shown in FIG. 3, alignment surfaces may be provided by one or more brackets 32 having slots 33 configured to form a mating contact fit with a tab or tabs 118 extending from a processing tray 100.

To facilitate electrical contact between the electrical contacts 40 and the leads 92 of a plurality of IC devices 90, the in-tray BIB 10 may also include one or more latching mechanisms 20 as shown in FIGS. 1 and 4. The latching mechanism 20 is configured to grasp a processing tray 100 and secure the processing tray 100 in an abutting relationship with the in-tray BIB 10. The latching mechanism 20 may be a mechanical clamping structure 20a as shown in FIG. 4. The clamping structure 20a may be adapted to grasp one or more tabs 118, or any other surface, of a processing tray 100. Alternatively, a vacuum head 20b may be associated with the in-tray BIB 10. Referring to FIG. 4, one or more vacuum ports 28 may be disposed on the interface surface 12 of the in-tray BIB 10. The vacuum ports 28 and vacuum head 20b are in fluid communication 26 with a vacuum source 25. Upon engagement with a processing tray 100, the vacuum ports 28 in the in-tray BIB 10 come into contact with one or more surfaces of the processing tray 100 to produce a negative pressure area between the in-tray BIB 10 and processing tray 100, thereby forming a vacuum lock between the processing tray 100 and in-tray BIB 10. Any other suitable device as known in the art that can be adapted to grasp a processing tray 100 may function as a latching mechanism 20.

In another embodiment shown in FIG. 5, the test system 5 may also include a sorting apparatus 600. The sorting apparatus 600 is configured to receive a plurality of tested and characterized IC devices 90 and to sort the IC devices 90 into a plurality of categories, or bins, depending on a particular IC device's electrical characteristics exhibited under test. The sorting apparatus 600 may include a pick-and-place mechanism 610 adapted to remove IC devices 90 from the processing trays 100. The pick-and-place mechanism 610 may transport the IC devices 90 to other processing trays, to customer trays for shipment, or to any other desired transport or storage medium. Further, the sorting apparatus 600 may be in electrical communication with the tester 400 via a conduit 82, the conduit 82 being any suitable cable or wiring as known in the art. The tester 400 may then provide the sorting apparatus 600 with data relating to the electrical characteristics of the IC device 90 located in each cell 116 on a processing tray 100, such that each IC device 90 may be transferred to the proper category or bin.

In another embodiment shown in FIG. 5, the test system 5 may also include a system controller 700. The system controller 700 may be in electrical communication with the tray source 200, displacement mechanism 300, tester 400, environmental chamber 500, and sorting apparatus 600 via electrical conduits 710. The conduits 710 may comprise any suitable cable or wiring as known in the art. The system controller 700 may be configured to control the operation of the test system 5 in order to perform an automated burn-in and test sequence, as well as subsequent sorting and binning operations. The system controller 700 may also be configured to control operation of the latching mechanisms 20, such as the clamping structure 20a and vacuum head 20b.

Figure 8:
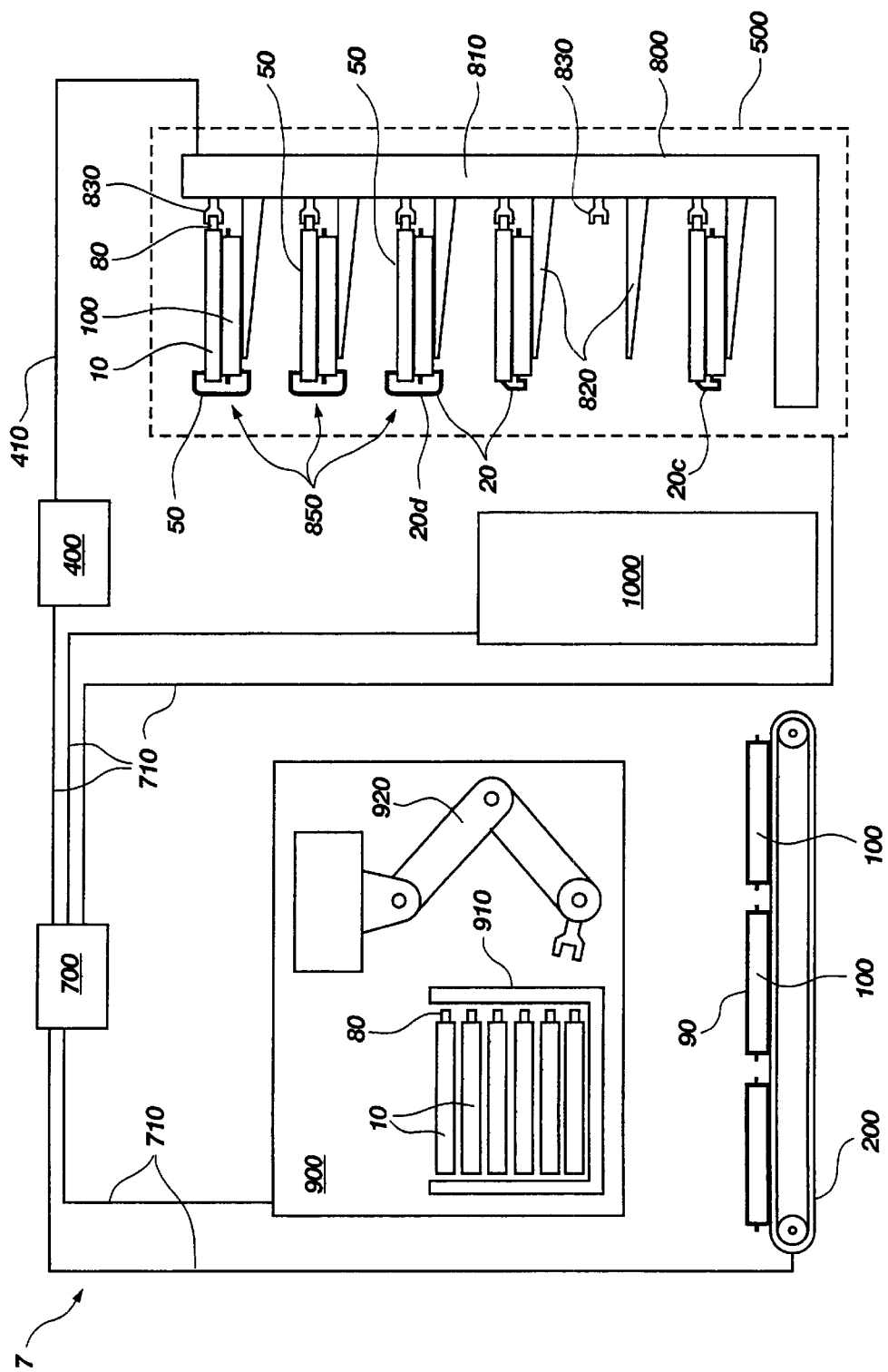
FIG. 8 is a schematic view of an IC device test system having a test frame and a plurality of in-tray burn-in boards according to this invention.

Shown in FIG. 8 is a further alternative embodiment of the present invention. Referring to FIG. 8, a plurality of test assemblies 50 is disposed in a test frame 800. Each test assembly 50 is comprised of at least one processing tray, and a plurality of IC devices disposed therein, coupled to an in-tray BIB 10. One or more latching mechanisms 20 secure the processing tray or trays 100 to the in-tray BIB 10, such that the plurality of electrical contacts 40 on the interface surface 12 of the in-tray BIB 10 is electrically coupled to the leads 92 extending from the IC devices 90 disposed in the processing tray or trays 100. The latching mechanisms 20 may be integral to the in-tray BIB 10—such as resilient tabs 20c attached to the in-tray BIB 10 and configured to grasp a surface of a processing tray 100—or, alternatively, the latching mechanisms 20 may be stand-alone—such as clamps 20d—as is depicted in FIG. 8, or any other suitable latching devices. It should be understood that each test assembly 50 may comprise multiple processing trays 100 interfacing with a single in-tray BIB 10.

The test frame 800 comprises a frame structure 810 that defines a plurality of test bays 850, each test bay 850 being configured to receive a test assembly 50 and to establish electrical communication therewith. Each test bay 850 includes a support structure or shelf 820 extending from the frame structure 810 and configured to support a test assembly 50. Each test bay 850 also includes a connector 830 configured to electrically connect to the electrical conduit 80 extending from an in-tray BIB 10. By way of example only, the electrical conduit 80 may be a male socket connector and the connector 830 may be a mating female socket connector.

Via the electrical conduit 80, the connector 830, and an electrical conduit 410, each test assembly 50 received in a test bay 850 is electrically connected to a tester 400. The electrical conduit 410 may comprise any suitable cable or wiring as known in the art. Thus, a plurality of processing trays 100 carrying IC devices 90 may each be secured to an in-tray BIB 10 to form a test assembly 50, and a plurality of test assemblies 50 may be simultaneously subjected to burn-in and other electrical testing in the test frame 800.

As shown in FIG. 8, the test frame 800 may be incorporated into a test system 7. The test system 7 may include, by way of example only, a tray source 200, a tester 400, a BIB source 900, and an assembly apparatus 1000. The assembly apparatus 1000 is configured to receive processing trays 100 from the tray source 200 and to receive in-tray BIBs 10 from the BIB source 900. The assembly apparatus 1000 is further configured to secure one or more processing trays 100 and an in-tray BIB 10 in mutual engagement to form a test assembly 50 and to transfer the test assembly 50 to a test bay 850 on the test frame 800 for testing. The assembly apparatus 1000 may be any suitable device, or combination of devices, as known in the art and may, by way of example only, include robotic arms and other automated manipulating devices, tracks, conveyors, and turntables, or any suitable combination thereof. It should be understood that a test assembly 50 may be manually assembled and inserted into a test bay 850 on the test frame 800. The BIB source 900 may be any suitable device adapted to deliver in-tray BIBs 10 to the assembly apparatus 1000. For example, the BIB source 900 may include a magazine 920, as depicted in FIG. 8, and an unloading mechanism 910, such as a robotic arm.

The test system 7 may further include an environmental chamber 500 that is sized and configured to receive a test frame 800 and accompanying test assemblies 50, and the IC devices 90 disposed therein. The test system 7 may also include a system controller 700 electrically coupled—via electrical conduits 710, which may be any suitable cable or wiring as known in the art—to the tray source 200, tester 400, environmental chamber 500, BIB source 900, and assembly apparatus 1000, and configured to control the operation of these systems. As was indicated with respect to the test system 5 shown in FIGS. 5 and 6, the test system 7 may also include sorting apparatus (not shown in FIG. 8) for sorting and binning tested and characterized IC devices 90. Those of ordinary skill in the art will appreciate that the test system 7 may comprise a single integrated test system.

Using the test system 7 in conjunction with the in-tray BIB 10 according to the present invention, a plurality of IC devices 90 may be tested in situ on processing trays 100 as will now be described. A plurality of IC devices 90 is disposed in one or more processing trays 100. The tray source 200 delivers one or more processing trays 100 and accompanying IC devices 90 to the assembly apparatus 1000, and the BIB source 900 delivers an in-tray BIB 10 to the assembly apparatus 1000. The assembly apparatus 1000 aligns at least one processing tray 100 with the in-tray BIB 10 and secures the processing tray or trays 100 into mutual engagement with the in-tray BIB 10 to form a test assembly 50. Latching mechanisms 20 secure the processing tray or trays 100 and in-tray BIB 10 to one another. Alignment surfaces 30 on the in-tray BIB 10 and corresponding locating features 120 on the processing trays 100 may facilitate alignment between the processing tray or trays 100 and the in-tray BIB 10. The assembly apparatus 1000 transfers each test assembly 50 to a test bay 850 on the test frame 800, such that the electrical conduit 80 of each in-tray BIB 10 is electrically coupled to a respective connector 830 on the test frame 800. When a desired number of test assemblies 50 is loaded into the test frame 800, the IC devices 90 disposed in the processing trays 100 may be subjected to operating electrical signals and biases by the tester 400.

For burn-in testing, the entire test frame 800, and accompanying test assemblies 50, may be placed in an environmental chamber 500. The test frame 800 may be manually placed in the environmental chamber 500 or, alternatively, automated handling equipment (not shown) may be used to place a test frame 800 in the environmental chamber 500. Also, a system controller 700 may control operation of the tray source 200, tester 400, environmental chamber 500, BIB source 900, and assembly apparatus 1000 during burn-in and electrical testing. Once testing of the IC devices 90 disposed in the test frame 800 is completed, the test assemblies 50 are unloaded and other test assemblies 50, and enclosed IC devices 90, may be loaded into the test frame 800 and tested.

Those of ordinary skill in the art will appreciate the advantages of the in-tray BIB 10 herein described. The in-tray BIB 10 allows a plurality of IC devices 90 disposed in one or more processing trays 100 to be subjected to burn-in and other electrical testing without the need to transfer the IC devices 90 from processing trays 100 to separate burn-in boards and, in some instances, without the subsequent step of unloading the IC devices 90 from the separate burn-in boards for transfer to other transport medium. Thus, a significant reduction in manufacturing resources—in terms of both time and cost—associated with handling IC devices is achieved using the in-tray BIB 10 of the present invention.

The in-tray BIB 10 can be adapted for use with any conventional processing tray design and, further, can be configured for use with any conventional type of IC package, or with bare semiconductor dice. Integrity of the electrical contact between the IC device leads 92 and the in-tray BIB 10 may be maintained by the addition of one or more alignment surfaces 30, one or more latching mechanisms 20, the use of spring-biased electrical contacts 40, or a combination thereof, to the in-tray BIB 10.

The in-tray BIB 10 may also be incorporated into a test system 5 that includes a tester 400, and that may further include an environmental chamber 500, or a sorting apparatus 600, in electrical communication with the tester 400. In addition, the test system 5 may be automated by the addition of a system controller 700. Automating the test system 5 with a system controller 700, in conjunction with in situ testing of IC devices 90 on processing trays 100 using the in-tray BIB 10 according to the present invention, allows a large number of IC devices 90 disposed in a plurality of processing trays 100 to be subjected to burn-in and other electrical testing with minimal intervention by a test operator and, additionally, with a significant reduction in manufacturing resources dedicated to handling the IC devices 90. In a further embodiment, a plurality of in-tray BIBs 10 is incorporated into a test system 7 that includes a test frame 800. A plurality of test assemblies 50, each comprising at least one processing tray 100 and accompanying IC devices 90 in mutual engagement with an in-tray BIB 10, may be placed in the test frame 800 for burn-in and other electrical testing. Thus, a large number of IC devices 90 may be simultaneously subjected to burn-in and other electrical testing using the test frame 800 in conjunction with a plurality of in-tray BIBs 10 according to the present invention.

The foregoing detailed description and accompanying drawings are only illustrative and not restrictive. They have been provided primarily for clearness of understanding and no unnecessary limitations are to be understood therefrom. Numerous modifications and alternative arrangements may be devised by those skilled in the art without departing from the spirt of the present invention and the scope of the appended claims.

What is claimed is:

1. A burn-in board for testing integrated circuit devices disposed in at least two trays, each of said at least two trays having a plurality of cells arranged in a pattern for receiving integrated circuit devices therein in orientations wherein leads thereof are accessible from above, comprising:

a generally planar substrate having a substantially planar interface surface;

a plurality of footprints disposed on said substantially planar interface surface and arranged substantially congruent with said pattern;

wherein each footprint of said plurality of footprints comprises a plurality of electrical contacts, each electrical contact of said plurality of electrical contacts being located on said substantially planar interface surface and configured for establishing direct electrical contact from above with at least one lead extending from one of said integrated circuit devices disposed on one of said at least two trays;

at least one other plurality of footprints disposed on said interface surface and arranged substantially congruent with said pattern;

wherein each footprint of said at least one other plurality of footprints comprises a plurality of electrical contacts, each electrical contact of said plurality of electrical contacts being located on said substantially planar interface surface and configured for establishing direct electrical contact from above with at least one lead extending from one of said integrated circuit devices disposed on another of said at least two trays.

2. The burn-in board of claim 1, further comprising at least one latching mechanism associated with said substrate and configured to attach at least one of said at least two trays to said substrate.

3. The burn-in board of claim 1, further comprising at least one alignment surface disposed on said substrate and configured to align at least one of said at least two trays relative to said interface surface responsive to contact with said at least one of said at least two trays.

4. The burn-in board of claim 1, further comprising at least one electrical conduit electrically coupled to said plurality of footprints and to said at least one other plurality of footprints, said at least one electrical conduit being configured for electrically connecting said integrated circuit devices to a tester.

5. The burn-in board of claim 1, further comprising:

at least one socket attached to said interface surface, said at least one socket including a plurality of electrical contacts defining a said footprint, each electrical contact of said plurality of electrical contacts of each said footprint being located and configured for establishing direct electrical contact with at least one lead extending from one of said integrated circuit devices disposed on one of said at least two trays; and at least one other socket attached to said interface surface, said at least one other socket including a plurality of electrical contacts defining at least another said footprint, each electrical contact of said plurality of electrical contacts of each said another said footprint being located and configured for establishing direct electrical contact with at least one lead extending from one of said integrated circuit devices disposed in another of said at least two trays.

* * * * *

UNITED STATES PATENT AND TRADEMARK OFFICE
CERTIFICATE OF CORRECTION

PATENT NO. : 6,476,629 B1
DATED : November 5, 2002
INVENTOR(S) : Russell S. Bjork It is certified that error appears in the above-identified patent and that said Letters Patent is hereby corrected as shown below:

<u>Column 5,</u>
Line 2, change "1 00" to -- 100 --

<u>Column 9,</u>
Line 30, change "920" to -- 910 --
Line 31, change "910" to -- 920 --

Signed and Sealed this

Thirtieth Day of March, 2004

JON W. DUDAS
*Acting Director of the United States Patent and Trademark Office*